United States Patent [19]
Levinson et al.

[11] 4,399,401
[45] Aug. 16, 1983

[54] METHOD FOR DESTRUCTIVE TESTING OF DIELECTRIC CERAMIC CAPACITORS

[75] Inventors: Solomon Levinson, Forest Hills, N.Y.; William Reilly, Centre Hall, Pa.

[73] Assignee: Centre Engineering, Inc., State College, Pa.

[21] Appl. No.: 296,452

[22] Filed: Aug. 26, 1981

[51] Int. Cl.³ ............................................. G01R 31/02
[52] U.S. Cl. ................................ 324/51; 324/60 CD
[58] Field of Search ................... 324/51, 60 CD, 60 C

[56] References Cited
U.S. PATENT DOCUMENTS

| | | | |
|---|---|---|---|
| 3,735,250 | 5/1973 | Masui | 324/51 |
| 3,755,711 | 8/1973 | Fendt | 324/51 X |

OTHER PUBLICATIONS

French, Electrolytic Capacitance Meter, Inspec., Radio & Electronics Constructor, Sep. 1974, pp. 82–85.
Anolick et al., Automatic Ramper for Simultaneous Monitoring of Many Capacitors, IBM Tech. Discl. Bull., Apr. 1978, pp. 4491, 4492.
Baker, Multilayer Ceramic Capacitors Testing Methods, Bell Laboratories Inc., Jul. 1980, pp. 1–99.

*Primary Examiner*—Stanley T. Krawczewicz
*Attorney, Agent, or Firm*—Berger & Palmer

[57] ABSTRACT

This invention covers a destructive testing procedure in which a voltage 2.5 times the rated voltage is applied to the capacitor, at a relatively high current. The resistance in series with capacitors being tested is reduced step-by-step until the resistance value is reached such that the percentage of capacitor failures on any given sample of capacitors remains constant. Thereafter, all similar capacitors are tested at that resistance value and at 2.5 times the rated voltage. Those which do not explode exhibit remarkable reliability.

6 Claims, 1 Drawing Figure

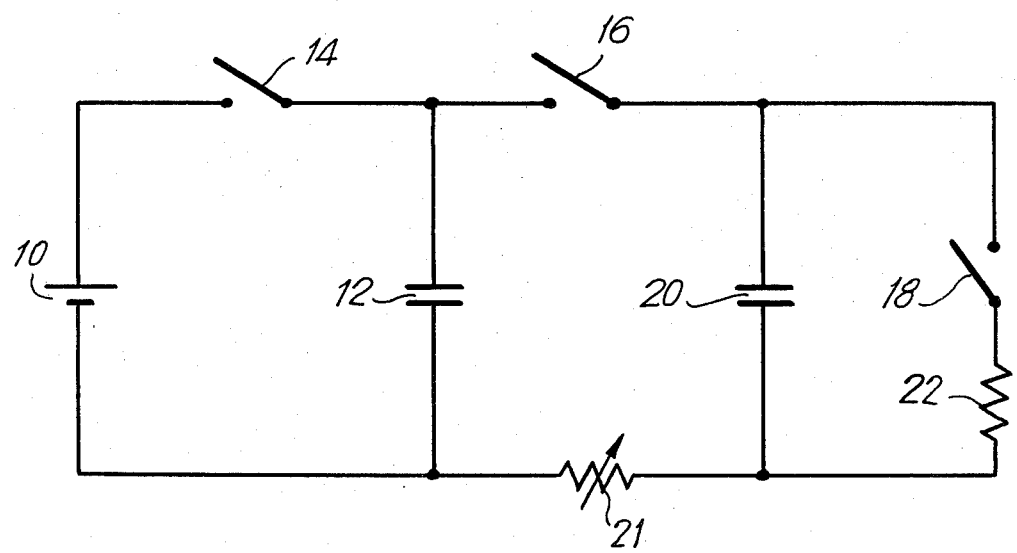

METHOD FOR DESTRUCTIVE TESTING OF DIELECTRIC CERAMIC CAPACITORS

BACKGROUND OF THE INVENTION

This invention relates to a method of testing dielectric ceramic capacitors, and more particularly, to a destructive test procedure for multi-layer capacitors.

Ceramic dielectric capacitors are manufactured and widely used. These capacitors are employed in numerous applications, and high reliability for such capacitors is very important. As a consequence, there has been a significant degree of attention directed to testing of capacitors in order to weed out those which may fail under normal operating conditions. Such tests include numerous procedures which apply excessive stress beyond the operating conditions normally encountered by the capacitor.

Multi-layer ceramic dielectric capacitors may use piezoelectric material as the dielectric. One common capacitor manufactured of a piece of electric dielectric is identified as an X7R type. These capacitors are widely used, and in at least one application, that identified as a frequency synthesizer, approximately 1600 capacitors are used.

A standard test employed for such capacitors is known as the dielectric withstanding voltage (DWV) test. In this test, a voltage approximately 2.5 times the rated voltage of the capacitor is applied to the capacitor. The current which flows through the capacitor is generally of low value, and the common test specs for the DWV test merely require application of this test voltage. It has been discovered that this test, among others, does not adequately weed out potentially faulty multi-layer ceramic dielectric capacitors. In fact, with current test procedures, the above described synthesizer capacitor components experience a failure rate of 1% during burn-in.

An object of this invention is to provide such a test procedure which provides that capacitors which pass the test have enhanced reliability.

Another object of this procedure is to provide such a procedure which uses relatively conventional techniques, so as to minimize the training required to perform such tests.

Still another object of this invention is to provide such a test which is quick, efficient, yet only passes capacitors having the highest reliability.

Other objects, advantages and features of this invention will become more apparent from the following description.

PRIOR ART STATEMENT

A paper presented by W. A. Baker, Jr. entitled *Multi-Layer Ceramic Capacitors Testing Method* during July 1980 describes standard tests employed. None of the tests suggests the novel procedure in which the destructive rate failure is maximized under repeated testing to determine a value for a resistance placed in series with a voltage source 2.5 times that rated voltage of the capacitor being tested. Additionally, the inventors witnessed pulse testing for multi-layer capacitors in which 100% destruction was sought.

SUMMARY OF THE INVENTION

In accordance with the principles of this invention, the above objects are accomplished by providing a destructive testing procedure in which a voltage 2.5 times the rated voltage is applied to the capacitor, at a relatively high current. The resistance in series with capacitors being tested is reduced step-by-step until the resistance value is reached such that the percentage of capacitor failures on any given sample of capacitors remains constant. Thereafter, all similar capacitors are tested at that resistance value and at 2.5 times the rated voltage. Those which do not short or explode exhibit remarkable reliability.

In particular, and in at least one application, it has been found that by using a voltage 2.5 times the rated voltage and employing a series resistor of no greater than one ohm, all X7R capacitors which passed exhibited significantly enhanced reliability. The voltage is applied across the capacitor for a minimum period of time. It has been found that a minimum time period of 5 seconds is adequate. During the test, there shall be no arcing, destructive discharge or mechanical damage.

BRIEF DESCRIPTION OF THE DRAWING

The FIGURE is an illustrative embodiment of one type of test apparatus employed in the test procedure of this invention.

DETAILED DESCRIPTION

A surge current type test is performed by switching a voltage across the capacitor terminals from a low impedance source. In the FIGURE, a voltage source 10 is shown which charges a large capacitor 12 by closing switch 14. Switches 16 and 18 remain open until capacitor 12 reaches the source voltage V. At that time, switch 14 is opened and switch 16 is closed. Some of the charge stored on capacitor 12 is transferred very rapidly through resistor 21 to the capacitor 20 which is being tested. A current pulse allows the charge stored on capacitor 12 to be transferred to capacitor 20. Capacitor 12 is much greater in value than capacitor 20, and the voltage across capacitor 20 is approximately equal to the source voltage 10. In accordance with the present invention, source voltage 10 is slightly greater than 2.5 times the rated voltage for capacitor 20, so that capacitor 20 charges to 2.5 times its rated voltage capacity. When this has occurred switch 16 is opened and switch 18 is closed. This discharges capacitor 20 through resistor 22, for safety reasons.

The initial current being carried through resistor 21 and the test capacitor 20 is very high, and the present invention comprises the following test procedure.

Variable resistor 21 is stepped down from a nominal 10 ohm value to approximately 0 ohms. At each half ohm step, a sample of similar multi-layer ceramic capacitors is tested in order to determine the percentage of the sample group which shorts or explodes. Generally, the percentage will level off at a maximum resistance value between 0 and 10 ohms. Each time the test is run, switch 16 is closed for the same minimum period of time, which is no less than five seconds.

Using the test method of this invention for the X7R type capacitor, it has been found that a resistance of one ohm at 2.5 times rated voltage yields such capacitors of significantly enhanced reliability. In one test environment, applicants have discovered produced X7R capacitors of such reliability that during the 80 hour burn-in period described above for the frequency synthesizer the failure rate has been 0. During normal burn-in transient currents encountered in capacitors tested by prior procedures have caused normally 30 capacitor failures.

Using capacitors which passed the testing procedure of the present invention, no failures occurred during the initial 80 hour burn-in, nor have failures occurred 30 days out in the field.

In summary, a new destructive test procedure is described in which a voltage of 2.5 times the rated capacitor voltage is applied through a series resistance of substantially low value. The value of the resistance is determined by repetitive destructive testing of groups of similar capacitors using different resistance values until the failure rate levels out. When the leveling off occurs, that value of resistance is selected as the test resistance value used for further testing of similar capacitors.

This increased reliability for capacitors tested by the present procedure is significant and of great importance, especially where component reliability is of extreme importance. Illustratively, the reliability of capacitors used in aerospace is often critical, and capacitor failure due to transients has been an ongoing problem. Capacitors tested which pass the present test procedure will exhibit improved reliability, and will withstand transients and other stresses found during normal operations where other capacitors may fail.

Although this invention has been described for testing multi-layer capacitors, it may also be used to test single-layer capacitors. Other type multi-layer capacitors such as the Z5U may advantageously be screened with the test procedure of this invention.

Additionally, other test circuits may be employed to apply voltage to capacitors being tested. The circuit shown in the FIGURE is illustrative of one such circuit which may be used.

What is claimed is:

1. A method of testing ceramic dielectric capacitors comprising the steps of
   a. applying a voltage of 2.5 times the rated voltage of said capacitor to said capacitor through a variable resistance,
   b. varying the value of said resistance from 0 ohms to a nominally low ohmic value,
   c. testing a plurality of groups of similar capacitors at each resistance value and determining the failure rate at each of said resistance values,
   d. setting a test resistance value equal to that at which the failure rate is substantially level, and
   e. applying a voltage 2.5 times the rated voltage for each further capacitor being tested through a resistance having a value determined in accordance with step d.

2. A test method as set forth in claim 1, further comprising the step of maintaining said voltage across each said capacitor for a predetermined minimum time period.

3. A test method as set forth in claim 2, further comprising the step of applying said voltage repeatedly for a minimum time period of 5 seconds.

4. A test method as set forth in claim 3, wherein said variable resistance is varied by 0.5 ohms at each test resistance value during step c.

5. A test method as set forth in claims 1 or 2, wherein said multilayer dielectric ceramic capacitor comprises an X7R type, said series resistance is equal to one ohm and said voltage is applied across each said capacitor being tested for a minimum of 5 seconds.

6. A test method as set forth in claim 1, wherein the capacitor comprises piezoelectric material.

* * * * *